(12) United States Patent
Whetsel

(10) Patent No.: US 7,395,467 B2
(45) Date of Patent: Jul. 1, 2008

(54) REMOVE SIGNAL FROM TAP SELECTION CIRCUITRY TO MULTIPLEXER CONTROL CIRCUITRY

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/626,011

(22) Filed: Jan. 23, 2007

(65) Prior Publication Data

US 2007/0118782 A1    May 24, 2007

Related U.S. Application Data

(62) Division of application No. 10/983,256, filed on Nov. 4, 2004, now Pat. No. 7,200,783.

(60) Provisional application No. 60/517,250, filed on Nov. 4, 2003.

(51) Int. Cl.
*G01R 31/28* (2006.01)
(52) U.S. Cl. .................................................... 714/724
(58) Field of Classification Search ................... None
See application file for complete search history.

(56) References Cited

U.S. PATENT DOCUMENTS

2001/0037479 A1 * 11/2001 Whetsel ..................... 714/724
2001/0037480 A1 * 11/2001 Whetsel ..................... 714/727
2002/0049928 A1 * 4/2002 Whetsel et al. ............. 714/30

OTHER PUBLICATIONS

"Inevitable use of TAP domains in SOCs" by Whetsel, L. International Test Conference Proceedings Publication Date : 2002 On p. 1191 ISSN:1089-3539 ISBN: 0-7803-7542-4 INSPEC Accession No. 7528895.*
"Test access of TAP'ed and non TAP'ed cores" by Whetsel, L. International Test Conference Proceedings 1997, Publication Date: Nov. 1-6, 1997 p. 1041 ISBN: 0-7803-4209-7 INSPEC Accession No. 5876914.*

* cited by examiner

*Primary Examiner*—Cynthia Britt
(74) *Attorney, Agent, or Firm*—Lawrence J. Bassuk; W. James Brady; Frederick J. Telecky, Jr.

(57) ABSTRACT

Today many instances of IEEE 1149.1 Tap domains are included in integrated circuits (ICs). While all TAP domains may be serially connected on a scan path that is accessible external to the IC, it is generally preferred to have selectivity on which Tap domain or Tap domains are accessed. Therefore Tap domain selection circuitry may be included in ICs and placed in the scan path along with the Tap domains. Ideally, the Tap domain selection circuitry should only be present in the scan path when it is necessary to modify which Tap domains are selected in the scan path. The present invention describes a novel method and apparatus which allows the Tap domain selection circuitry to be removed from the scan path after it has been used to select Tap domains and to be replaced back into the scan path when it is necessary to select different Tap domains.

5 Claims, 12 Drawing Sheets

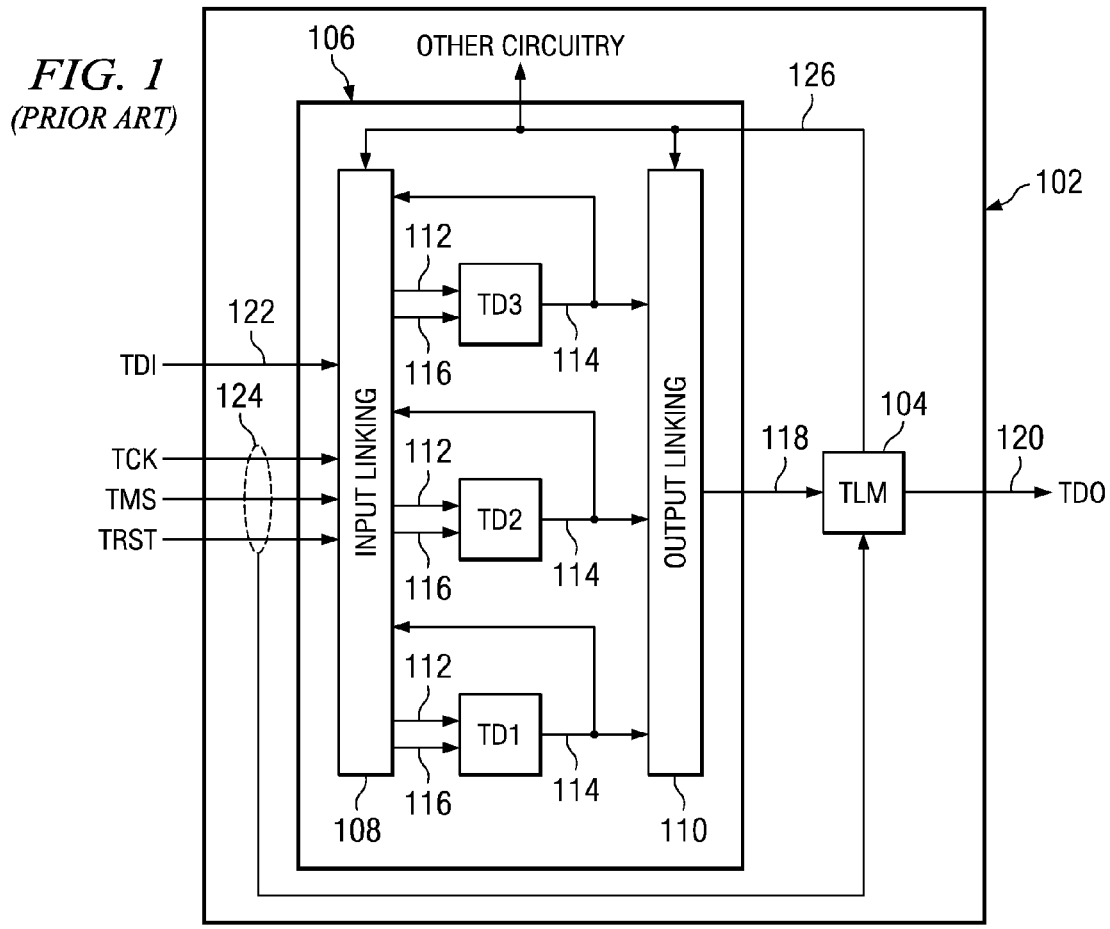
*FIG. 1*
*(PRIOR ART)*
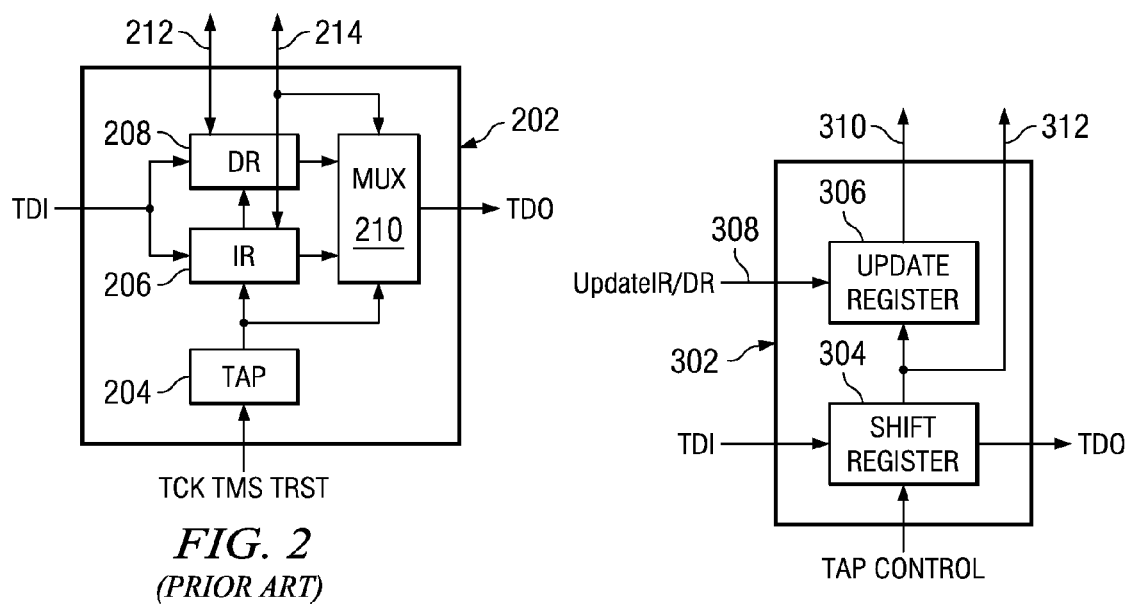
*FIG. 2*
*(PRIOR ART)*
*FIG. 3*
*(PRIOR ART)*

REMOVE SIGNAL FROM TAP SELECTION CIRCUITRY TO MULTIPLEXER CONTROL CIRCUITRY

This application is a divisional of application Ser. No. 10/983,256, filed Nov. 4, 2004, now U.S. Pat. No. 7,200,783, issued Apr. 3, 2007; which claims priority from Provisional Application 60/517,250, filed Nov. 4, 2003.

CROSS REFERENCE TO RELATED APPLICATIONS

This application is related to 1) application Ser. No. 08/918,872, filed Aug. 26, 1999, now U.S. Pat. No. 6,073,254, "Selectively Accessing Test Access Ports in a Multiple Test Access Port Environment", which is hereby incorporated by reference, 2) application Ser. No. 09/458,313, filed Dec. 10, 1999, now U.S. Pat. No. 6,324,614, issued Nov. 27, 2001, TAP With Scannable Control Circuit For Selecting First Test Data Register In TAP Or Second Test Data Register In TAP Linking Module For Scanning Data", which is hereby incorporated by reference, 3) application Ser. No. 09/277,504, filed Mar. 26, 1999, now U.S. Pat. No. 6,324,662, issued Nov. 27, 2001, "A TAP and Linking Module for Scan Access of Multiple Cores with IEEE 1149.1 Test Access Ports", which is hereby incorporated by reference, and 4) application Ser. No. 60/207,691, filed May 26, 2000, now U.S. Pat. No. 7,058,862, issued Jun. 6, 2006, "Selecting Different 1149.1 TAP Domains From Update-IR State", which is hereby incorporated by reference. This application claims priority under 35 USC 119(e)(1) of provisional patent application Ser. No. 60/517,250, filed Nov. 4, 2003.

BACKGROUND OF INVENTION

Today's ICs may contain many embedded 1149.1 TAP domains. Some of these TAP domains are associated with intellectual property (IP) core circuits within the IC, and serve as access interfaces to test, debug, emulation, and programming circuitry within the IP cores. Other TAP domains may exist in the IC which are not associated with cores but rather to circuitry in the IC external of the cores. Further, the IC itself will typically contain a TAP domain dedicated for operating the boundary scan register associated with the input and output terminals of the ICs, according to IEEE std 1149.1.

FIG. 1 illustrates an example architecture for selecting Tap domains within an IC 102. This architecture is described in detail in referenced U.S. Pat. No. 7,058,862. In the architecture, Tap domains 1-3 (TD1-TD3) are shown to exist between input linking circuitry 108 and output linking circuitry 110 of circuit block 106. While three Tap domains TD1-TD3 are shown in this example, any number of Tap domains may exist between the input and output linking circuitry. Each Tap domain TD1-TD3 has a Test Data Input (TDI) 112 coupled to the input linking circuitry 108, a Test Data Output (TDO) 114 coupled to the input linking circuitry 108 and output linking circuitry 110, and a control interface 116 consisting of Test Clock (TCK), Test Mode Select (TMS), and a Test Reset (TRST) signals coupled to the input linking circuitry. The input linking circuitry 108 is coupled to a TDI input 122 to the IC and to TCK, TMS, and TRST control inputs 124 to the IC. The input and output linking circuits 108 and 110 are described in detail in the above reference application and serve basically as multiplexing circuits that selectively link Tap domains together serially between the IC's TDI 122 and TDO 120 leads. The input linking circuitry also couples the IC's TCK and TMS inputs to the selected Tap domains control inputs 116 so they can receive control to operate when coupled to the IC's TDI 122 and TDO 120 leads. To be compliant to the IEEE 1149.1 boundary scan standard, the data on the IC's TDI 122 lead is clocked into the architecture on the rising edge of TCK 124 and the data on the IC's TDO 120 lead is clocked from the architecture on the falling edge of TCK 124. While not shown, circuitry is assumed to exist on the TDO 120 lead to allow data from the architecture to be clocked out on the falling edge of TCK.

The Tap Domain Selection (TDS) circuit 104 is coupled to the IC's TDO output via serial path 120, to the output linking circuitry 110 via serial path 118, to the input and output linking circuits 108 and 110 via control bus 126, and potentially to other circuits in the IC via control bus 126. The TDS circuit is also coupled to the IC's TCK, TMS, and TRST input leads 124. In response to control bus 126 input from TDS 104, the input and output linking circuitry may serially connect any one or combination of Tap domains TD1-TD3 between the IC's TDI 122 and serial path 118 to the TDS for access. For example, Tap domain connections may be made between the IC's TDI 122 and serial path 118 that includes; TD1 only, TD2 only, TD3 only, TD1 and TD2, TD1 and TD3, TD1 and TD2 and TD3, or TD2 and TD3. As seen, the TDS circuit remains in the scan path, along with the selected Tap domains, to complete the serial connection path between the IC's TDI 122 and TDO 120 leads. In the referenced U.S. Pat. No. 7,058,862, the TDS was referred to as a Tap Linking Module (TLM). The TDS of this application is slightly different from the TLM, and so it has been named differently. With the exception of TDS 104, the architecture of FIG. 1 is like that described in U.S. Pat. No. 7,058,862.

FIG. 2 illustrates a simple example of an IEEE 1149.1 Tap domain architecture 202. The Tap domain architecture includes a Tap controller 204, an instruction register (IR) 206, at least one data register (DR) 208, and multiplexer circuitry 210. Each of the Tap domains TD1-TD3 and the TDS 104 are based on Tap domain architecture 202. The above mentioned difference between the TDS and TLM was that the TLM did not necessarily require a DR in the Tap domain architecture, a direct connection between TDI and TDO could be used in place of a DR in the TLM. It should be understood however, that the TLM could be substituted for the TDS if desired to make to the two Tap domain architectures be the same. In response to TCK and TMS control inputs to Tap controller 204, the Tap controller outputs control to capture data into and shift data through either the IR 206 from TDI to TDO or a selected DR 208 from TDI to TDO. The data shifted into IR 206 is updated and output on bus 214, and the data shifted into a DR is updated and output on bus 212. DR 208 may also capture data from bus 212 and IR 206 may capture data from bus 214. Buses 212 and 214 form bus 126 of TDS 104 in FIG. 1. In response to a TRST input to the Tap controller 204, the TAP controller, IR and DR are reset to known states. The structure and operation of IEEE 1149.1 Tap domain architectures like that of FIG. 2 are well known.

FIG. 3 illustrates in more detail the structure 302 of the IR 206 and DR 204 of FIG. 2. As seen, the structure 302 includes a shift register 304 coupled to TDI and TDO for shifting data, and an update register 306 coupled to the parallel outputs of the shift register for updating data from the shift register. If FIG. 3 is seen to represent IR 206, the shift register 304 will shift data from TDI to TDO in response to the Tap controller being in the Shift-IR state 1210 of FIG. 12. Following the shift operation, the Tap controller will output an UpdateIR signal 308, in the Update-IR state 1212 of FIG. 12, to cause the update register 306 to parallel load the data shifted into the shift register. If FIG. 3 is seen to represent DR 208, the shift register 304 will shift data from TDI to TDO in response to the Tap controller being in the Shift-DR state 1214 of FIG. 12. Following the shift operation, the Tap controller will output an UpdateDR signal 308, in the Update-DR state 1216 of FIG. 12, to cause the update register 306 to parallel load the data shifted into the shift register. If seen as a DR, bus outputs 310 and 312 represent bus 212 of FIG. 2. If seen as an IR, bus outputs 310 and 312 represent bus 214 of FIG. 2. Bus 310 is the normal update output bus from the update register. Bus 312 is a bus output from the shift register. The use of bus 312 by the present invention will be described later in regard to FIG. 11.

FIG. 4 is provided to simply show that TDS 104 can be positioned before Tap domain circuit block 106 if desired. The TDS still operates the same to select Tap domains in circuit block 106, it is just repositioned in the IC's TDI to TDO scan path.

FIG. 5 illustrates an example 502 where four ICs 102 are connected together serially from TDI 504 to TDO 506 on a board or other substrate. This example illustrates use of referenced U.S. Pat. No. 7,058,862. Each IC 102 is also connected to TCK, TMS, and TRST 508 control inputs on the board or other substrate. In this arrangement, each IC's internal Tap domains in circuit block 106 can be selected, via each IC's TDS 104, to be included in or excluded from the TDI 504 to TDO 506 scan path. For clarification, one TAP domain 202 comprising an IR 206 and a DR 208 is shown being selected within each IC's TAP domain circuit block 106 of arrangement 502. As seen, the TDS's of each IC 102 are always included in the scan path from TDI 504 to TDO 506. Maintaining the TDS's in the TDI 504 and TDO 506 scan path after they have served their purpose of selecting Tap domains hinders the optimization of serial test, debug, emulation, and/or programming operations. For example, during test, debug, emulation, and/or programming operations, 1149.1 instruction scan operations to IRs 208 and data scan operations to DRs 208 may be used intensely. Having to pad the instruction and data scan patterns with the additional bits required to traverse the TDS's IR 206 and DR 208 scan paths extends the scan pattern length beyond that of the selected Tap domain's IR 206 and DR 208. Also it requires editing each individual instruction and data scan pattern transmitted from TDI 504 to TDO 506 to insert the padding bits for the TDS circuit's IR 206 and DR 208.

It is therefore desirous to provide a method of removing TDS circuits from a TDI to TDO scan path after they have been used to select Tap domains and to provide a method of replacing TDS circuits back into a TDI to TDO scan path when it is necessary to again access them to select a new group of Tap domains for access in a TDI to TDO scan path. It is an object of the present invention that the removal of TDS circuits from the TDI to TDO scan path be achieved using only the IC's IEEE 1149.1 interface signal leads. It is also an object of the present invention that the replacement of TDS circuits back into the TDI to TDO scan chain be achieved using only the IC's IEEE 1149.1 interface signals and without having to:

1. reset the Tap domain test logic in an IC by activating the TRST input or by cycling the Tap controller of the Tap domains into the Test Logic Reset state using the TMS input,
2. cycle power to the ICs,
3. in any way alter or lose any stored state information in the ICs functional and Tap domain test circuitry, or
4. disturb the state of any legacy Tap domains of ICs in the scan path that do not use the Tap domain selection architecture of FIG. 1 or 4.

FIELD OF THE INVENTION

This invention relates in general to integrated circuit designs, and in particular to improvements in the design of IEEE 1149.1 Tap domain based test, debug, emulation, and programming architectures included in integrated circuits.

SUMMARY OF THE INVENTION

The present invention provides a method of removing and replacing Tap domain selecting (TDS) circuits in a TDI to TDO scan path. The TDS removal and replacement processes are achieved using only the standard 1149.1 interface leads of the IC. Importantly, the TDS replacement process is achieved without needing to; (1) reset the ICs test logic, (2) cycle power to the IC, (3) alter/lose any stored state information in the ICs functional/test circuitry, or (4) disturb the state of legacy IC Tap domains.

DESCRIPTION OF THE VIEWS OF THE DRAWINGS

FIG. 1 illustrates an example of an IC that includes multiple Tap domains and a Tap Domain Selection (TDS) circuit.

FIG. 2 illustrates an example of an IEEE 1149.1 Tap domain architecture.

FIG. 3 illustrates an example of the shift register and update register sections of an IEEE 1149.1 instruction or data register.

DETAILED DESCRIPTION OF INVENTION

Figure 4:
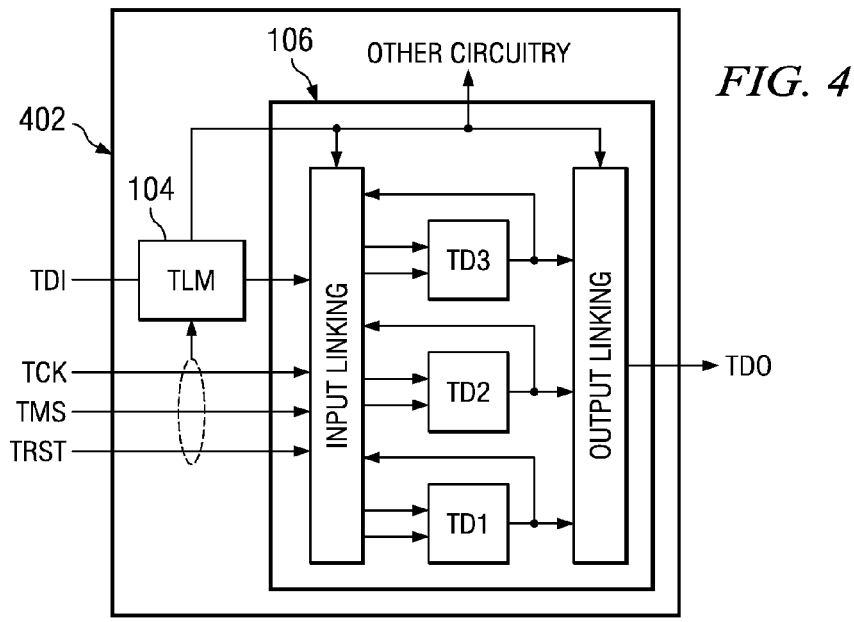
FIG. 4 illustrates an alternate placement of the TDS circuit of the example in FIG. 1.
Figure 5:
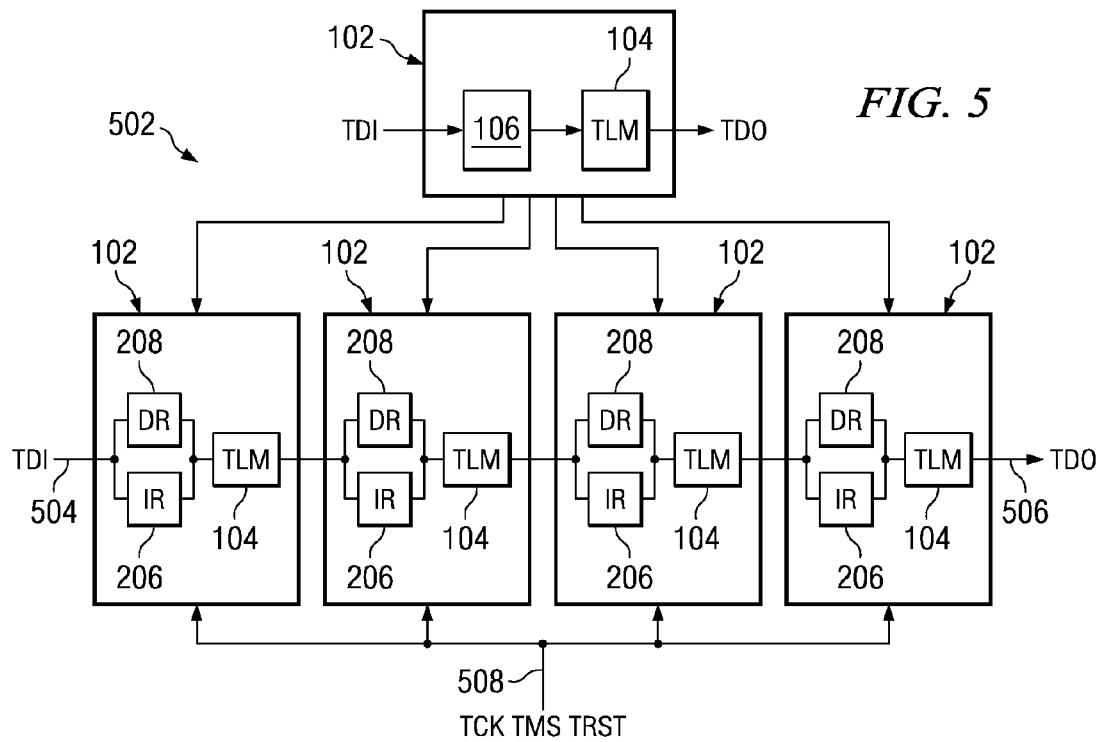
FIG. 5 illustrates a first scan path configuration whereby the ICs in the scan path contain multiple Tap domains and a TDS circuit.
Figure 6:
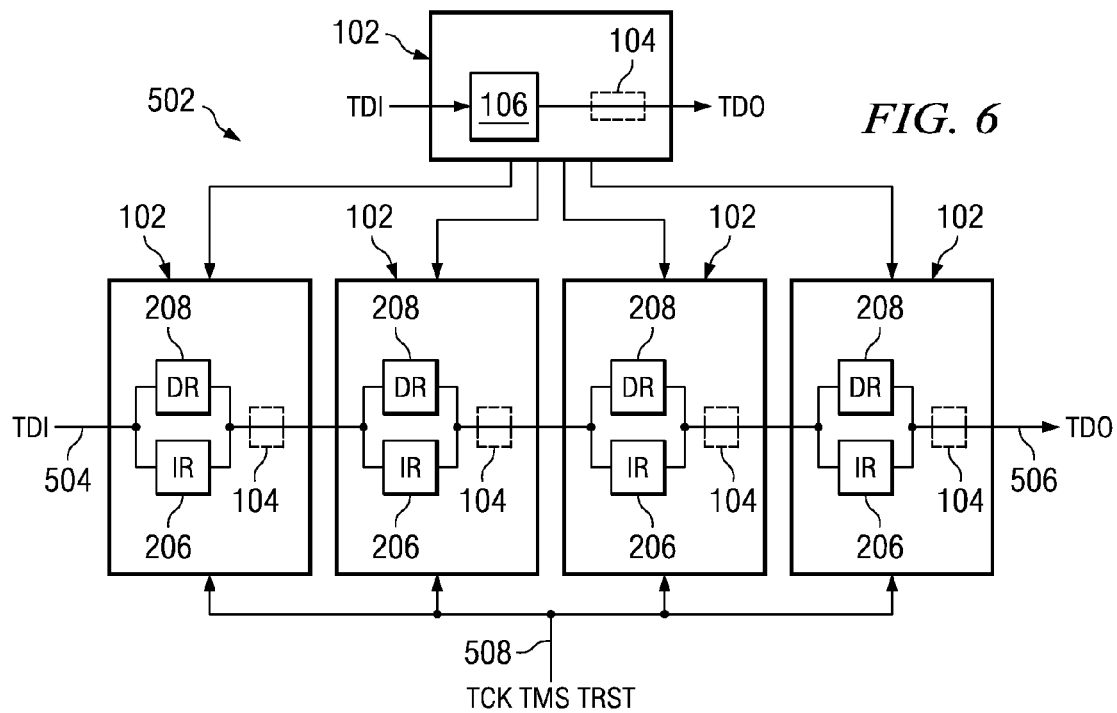
FIG. 6 illustrates a second scan path configuration whereby the ICs in the scan path contain multiple Tap domains and a TDS circuit.

FIG. 6 illustrates the example 502 of FIG. 5 whereby the TDS circuits 104 have been removed from the TDI 504 and TDO 506 scan path according to the present invention. As seen, after the TDS circuits 104 are removed, as indicated conceptually by the signal path passing through dotted line circuit block 104, each IC's TDI to TDO scan path only includes the selected Tap domain's IR 206 and DR 208 in the circuit block 106. The IC's TDS circuit 104 therefore does not contribute IR and DR pad bit lengths to instruction and data scan operations occurring in the selected Tap domains of the ICs. Replacing the TDS circuits back into the scan path again enables access to the TDS circuit's IR 206 and DR 208 as shown in the example 502 of FIG. 5 to allow selecting different Tap domains in the ICs. The replacement of TDS circuits back into the scan path is advantageously achieved by the present invention using only the IEEE 1149.1 IC test leads and without requiring any of the listed items 1-4 above.

FIG. 5 illustrates that each IC in the TDI to TDO scan path contains the Tap domain selection architecture of FIG. 1. However, in practice, legacy or preexisting ICs may be used in the TDI to TDO scan path along with ICs that include the Tap domain selection architecture.

Figure 7:
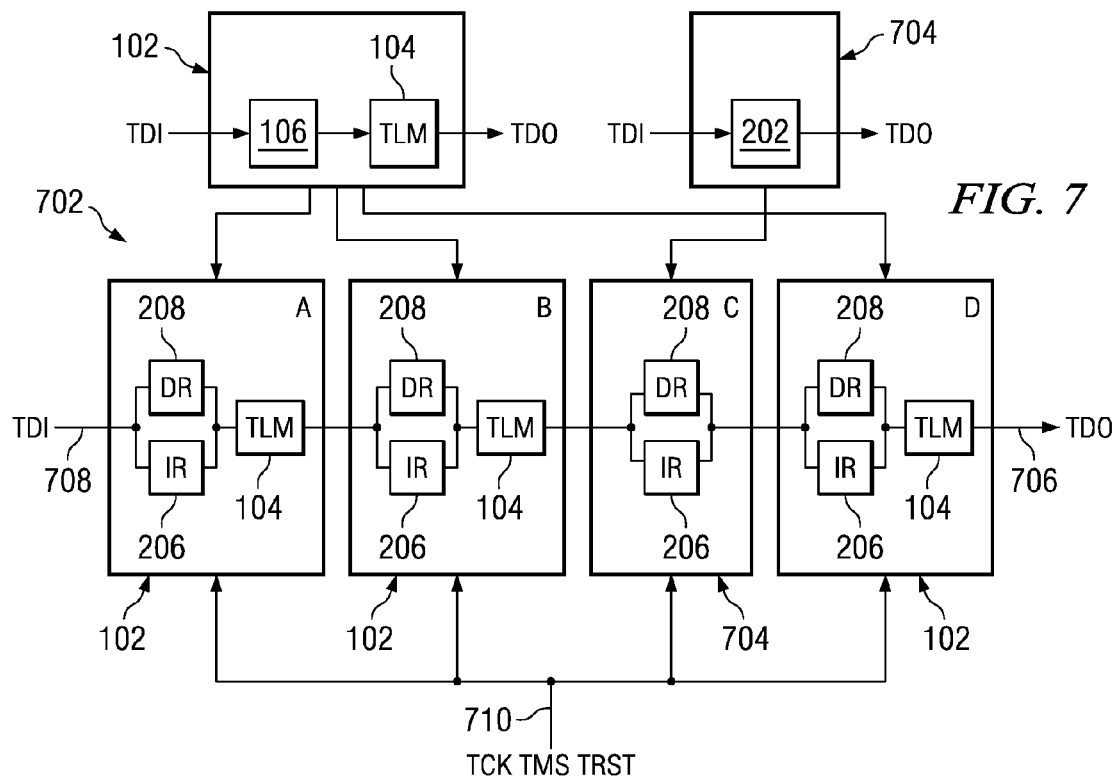
FIG. 7 illustrates a first scan path configuration that consists of ICs containing Tap domains and a TDS circuit and a legacy IC that contains only one Tap domain.

FIG. 7 illustrates an example scan path of ICs 702 that includes at least one of the above mentioned legacy ICs 704 (C). The legacy IC 704 (C) does not include the Tap domain selection architecture of the other ICs 102 (A,B,D) in the scan path. In this example, the legacy IC (C) is assumed to contain only one Tap domain 202 between its TDI and TDO leads. This one Tap domain may be the IC's 704 IEEE 1149.1 boundary scan Tap domain. With the TDS circuits in the scan path, instruction scan operations pass through the IRs 206 of the selected Tap domains and TDS circuits of ICs 102 (A,B, D), and through the IR 206 of IC 704 (C). Likewise, with the TDS circuits in the scan path, data scan operations pass through the DRs 208 of the selected Tap domains and TDS circuits of ICs 102 (A,B,D), and through the DR 208 of IC 704 (C).

Figures 8, 9:
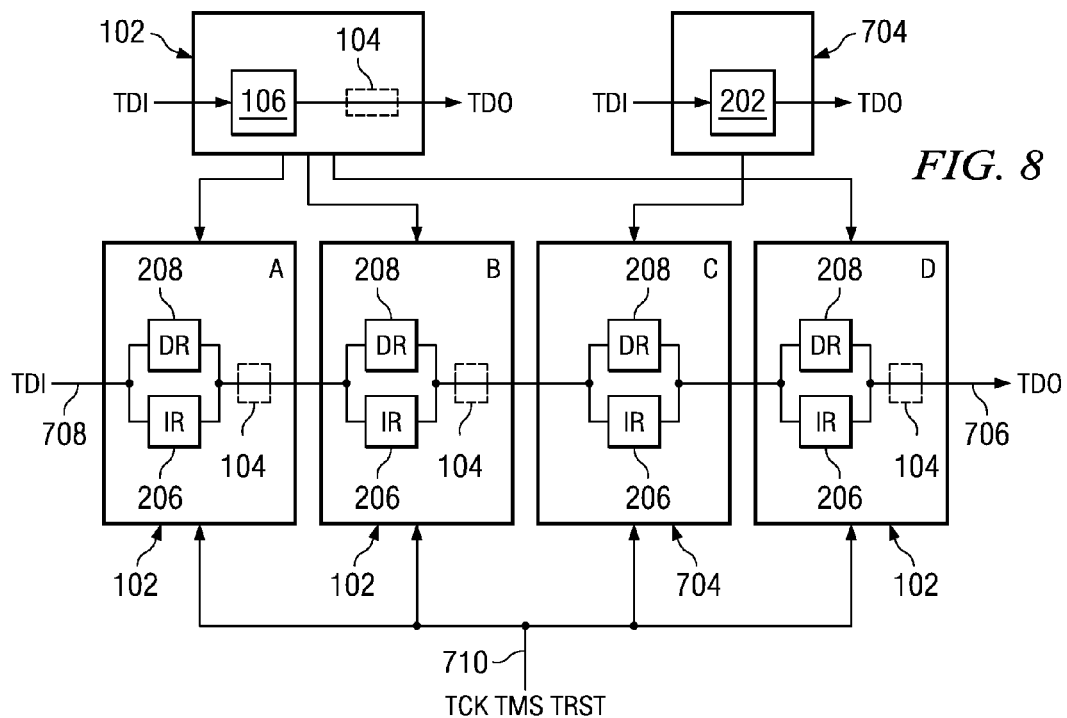
FIG. 8 illustrates a second scan path configuration that consists of ICs containing Tap domains and a TDS circuit and a legacy IC that contains only one Tap domain.
FIG. 9 illustrates an example IC that includes multiple Tap domains and circuitry for removing and replacing the TDS circuit in the IC's scan path according to the present invention.

FIG. 8 illustrates the scan path example 702 whereby the TDS circuits of ICs 102 (A,B,D) have been removed from the scan path as they were in FIG. 6, leaving only the IRs 206 and DRs 208 of the ICs (A,B,C,D) between TDI 708 and TDO 706. The process of removing the TDS circuits in ICs (A,B,D) is achieved via the IEEE 1149.1 test bus and is transparent the legacy IC (C). When it is necessary to select different Tap domains in ICs (A,B,D), the TDS circuits are again inserted into the TDI 708 to TDO 706 scan path as seen in FIG. 7. According to the present invention, the process of replacing the TDS circuits back into the scan path is achieved via the IEEE 1149.1 test bus and without requiring any of the listed items 1-4 above, which includes not having to modify the state of Tap domain(s) in legacy ICs (C).

FIG. 9 illustrates an IC 902 showing in detail the modifications to the Tap domain selection architecture of FIG. 1 to achieve the TDS circuit removal and replacement operations. As can be seen the modifications are contained in circuit block 916 and include a multiplexer (M) circuit 904, a multiplexer control (MC) circuit 906, and a modified TDS circuit 920. The Tap domain circuit block 106 of IC 902 remains the same as in FIG. 1. TDS circuit 920 receives the serial output 118 from Tap domain circuit block 106, control input from bus 124, and a control input from multiplexer control circuit 906. TDS circuit 920 outputs a serial output 918 to one input of multiplexer circuit 904, the control bus 126, and a control signal 908 to multiplexer control circuit 906. The other input of multiplexer circuit 904 is connected to the serial output 118 from Tap domain circuit block 106. The output of multiplexer circuit 906 is coupled to the TDO lead 912 of IC 902. The multiplexer control circuit 906 receives an input 910 from the TDS control bus 126, inputs 908 from the Tap controller 204 within TDS circuit 920, and an input from the externally accessible TMS lead on bus 124. The multiplexer control circuit 906 outputs a control signal 914 to multiplexer 904 and TDS circuit 920. The control signal 914 to multiplexer 904 is used to couple one of the multiplexer circuits inputs to the IC's TDO lead. The control signal 914 to TDS circuit 920 is used to enable or disable the IR 206 and DR 208 paths of TDS circuit 920.

Figure 12:
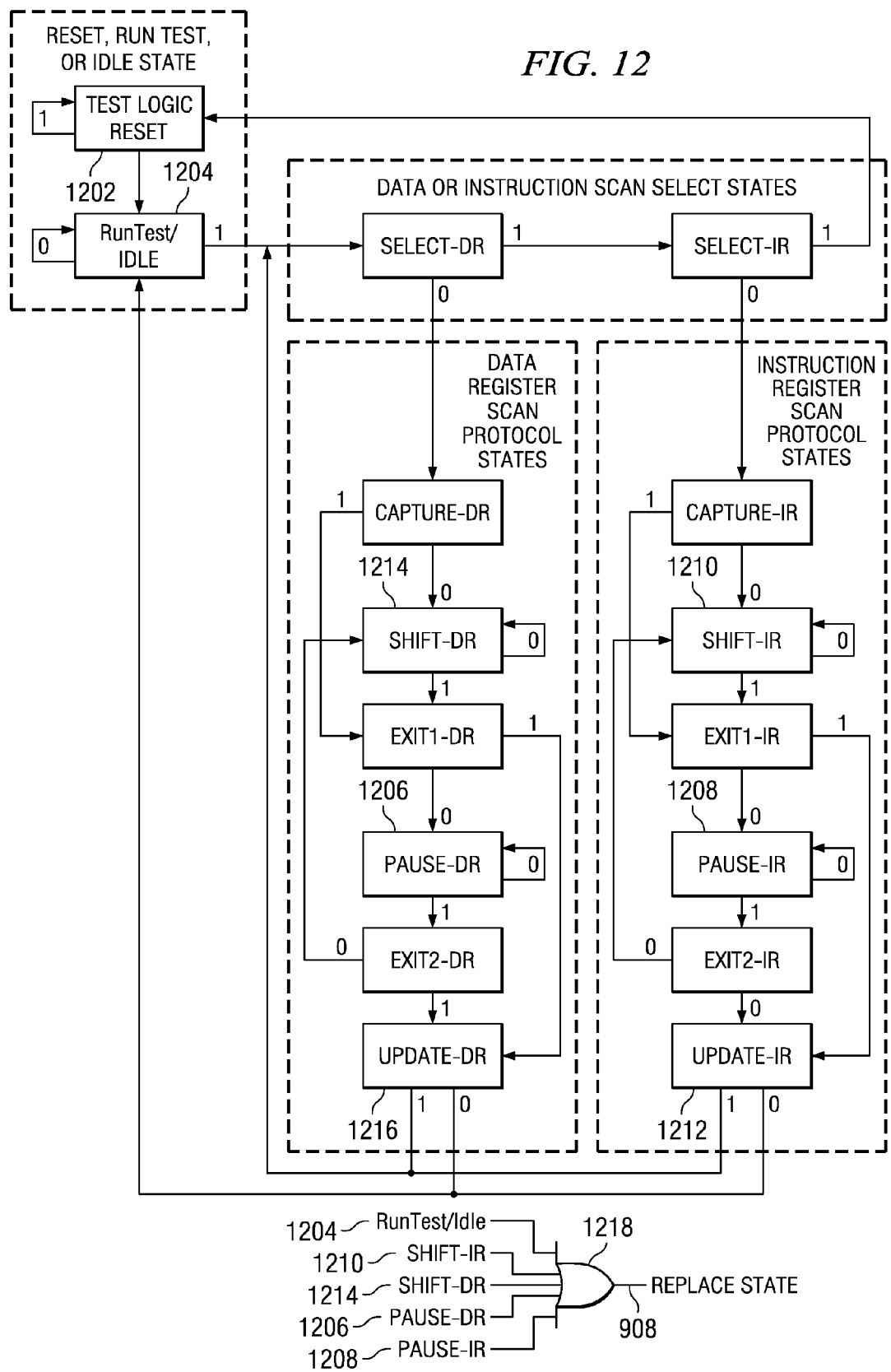
FIG. 12 illustrates the state diagram of an IEEE standard 1149.1 Tap controller.

Following a power up of IC 902 or upon the Tap controller 204 being placed in the Test Logic Reset state 1202 of the Tap state diagram in FIG. 12, signal 914 from the multiplexer control circuit 906 will be set to couple the serial output 918 of TDS circuit 920 to the IC's TDO lead 912 such that instruction and data scan operations occurring in IC 902 will include the TDS circuit's IR 206 and DR 208 paths. Also control signal 918 will be set to enable control bus 124 to control access to the IR 206 and DR 208 paths of TDS circuit 920. In this condition, the Tap domain selection architecture in IC 902 operates to select Tap domains in circuit block 106 like the Tap domain architecture of IC 102 of FIG. 1. When Tap domains have been selected and it is desired to remove the TDS circuit from the ICs TDI 122 to TDO 912 scan path, the TDS circuit 920 will output a signal 910 on control bus 126 to the multiplexer control circuit 906. In response to this signal, multiplexer control circuit 906 will output control on signal 914 that; (1) causes multiplexer 904 to couple serial path 118 to the IC's TDO lead 912 which removes the TDS circuit 920 from the IC's TDI to TDO scan path, and (2) disables bus 124 from being able to control the TDS circuit's IR 206 and DR 208 scan paths. In this condition, the TDS circuit 920 is removed from the IC's TDI to TDO scan path and the present state of the TDS circuit's IR and DR paths is maintained until the TDS circuit 920 is replaced back into the IC's TDI to TDO scan path.

When it is necessary to replace the TDS circuit 920 back into the IC's TDI to TDO scan path to allow selecting a different one or more Tap domains in circuit block 106, a special protocol is input on the IC's TCK and TMS signal leads. This special protocol is designed to be recognized only by the multiplexer control circuit 906. The Tap controllers 204 of the selected Tap domains and TDS circuit 920 do not recognize the input of the special protocol and simply ignore its input. When input, the special protocol causes the control output 914 from multiplexer control circuit 906 to be set back into the state that; (1) couples the TDS circuit's serial output 918 to the IC's TDO lead 912 via multiplexer 904, and (2) enables control bus 124 to again control the IR 206 and DR 208 scan paths in TDS circuit 920. This special protocol is one of the key aspects of the present invention.

Figure 10:
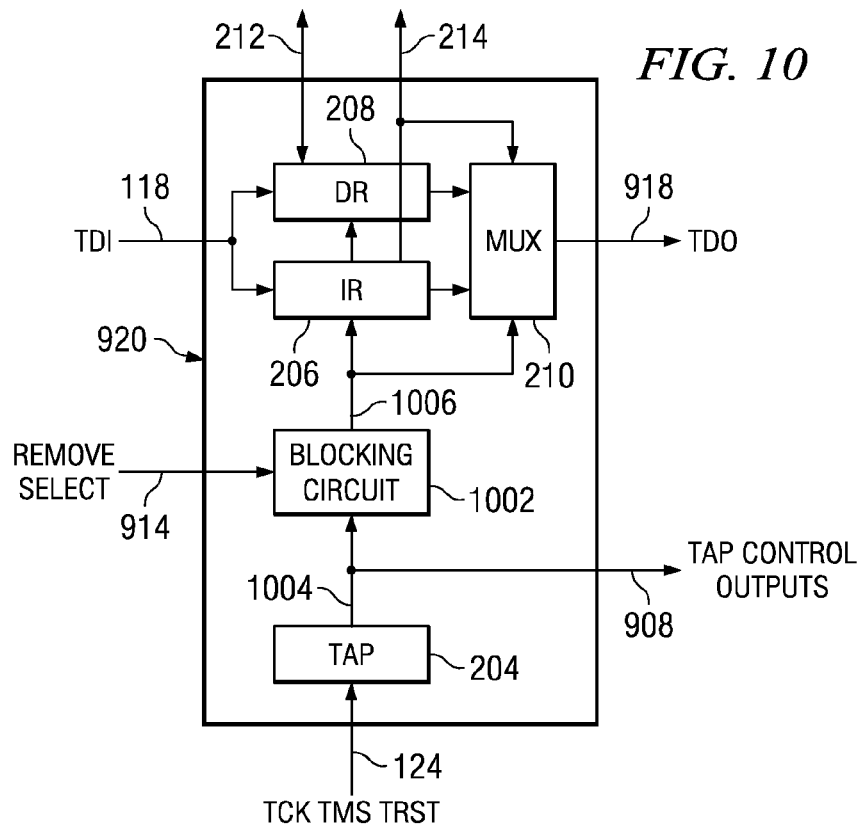
FIG. 10 illustrates an example Tap controller design for use in TDS circuits to facilitate the removal and replacement of the TDS circuit according to the present invention.

FIG. 10 illustrates the details of the TDS circuit 920. TDS circuit 920 differs from the TDS circuit 104 which, as previously mentioned, appears as a conventional Tap domain 202 shown in FIG. 2. A first difference is that the TDS circuit 920 includes a blocking circuit 1002 which is located between the Tap controller's output bus 1004 and the control input bus 1006 to the IR and DR scan paths. When the TDS circuit 920 is included in the IC's TDI to TDO scan path, the Remove Select signal 914 from the multiplexer control circuit 906 will be set to allow signals to pass through the blocking circuit 1002 from the Tap controller output bus 1004 to the input bus 1006 to the IR and DR scan paths, enabling the Tap controller to control the IR and DR scan paths during instruction and data scan operations. However, when the TDS circuit 920 is removed from the IC's TDI to TDO scan path, the Remove Select signal 914 will be set to disable signals from the Tap controller output bus 1004 from passing through blocking circuit 1002 to be input to the IR and DR scan paths via input bus 1006. When TDS circuit 920 is removed, the output bus 1006 from blocking circuit 1002 will be set to states that prevent operation of the IR and DR scan paths. Thus when the TDS circuit 920 is removed from the IC's scan path, the values stored in the TDS circuit's IR and DR scan paths do not change during subsequent instruction and data register scan operations that occur in the IC's TDI to TDO scan path. The only signal from the Tap controller output bus 1004 that is not blocked from being input to the IR and DR input bus 1006 is the Tap controller's Reset signal. The Tap controller's Reset signal is asserted low whenever the Tap controller 204 enters the Test Logic Reset state 1202 to initialize/reset the IR, DR, and other circuitry that needs to be initialized. The Tap controller's Reset signal passes through the blocking circuit 1002 independent of the state of the Remove Select signal 918. This insures that the IR and DR scan paths of the TDS circuit 920 can be initialized to known states whenever the Tap controller 204 enters the Test Logic Reset state 1202 of the Tap state diagram of FIG. 12.

A second difference is that the TDS circuit 920 includes a Tap controller 204 output bus 908 which is input to the multiplexer control circuit 906. As will be described in more detail later in regard to FIG. 11, the Tap controller output bus 908 provides control signals and Tap state information to allow the multiplexer control circuit 906 to perform its functions of, (1) removing the TDS circuit 920 from the IC's TDI to TDO scan path, and (2) replacing the TDS circuit 920 back into the IC's TDI to TDO scan path. It is important to note that the Tap controller 204 of TDS circuit 920 continues to follow the IEEE 1149.1 protocol on the TCK and TMS inputs of bus 124, independent of the value of the Remove Select signal 914. Thus Tap control output bus 908 is always in lock step with the IEEE 1149.1 TCK and TMS protocol. This allows the Tap controller 204 of a removed TDS circuit 920 to remain protocol synchronous with the selected Tap domains in circuit block 106. Maintaining protocol synchronization between a removed TDS circuit and the selected Tap domains in circuit block 106 ensures that the Tap controllers of selected Tap domains and TDS circuit are moving through the same Tap controller states together. This is important since the special protocol used to replace a TDS circuit back into an IC's TDI to TDO scan path should only be issued during selected Tap controller states that are assumed to be in common with and synchronized to both the TDS's Tap controller and the Tap domain's Tap controller. In this specification, the selected states for enabling the special protocol to be issued include the RunTest/Idle state 1204, Shift-IR state 1210, Shift-DR state 1214, Pause-IR state 1208, and Pause-DR state 1206 of the Tap state diagram in FIG. 12.

Figure 11:
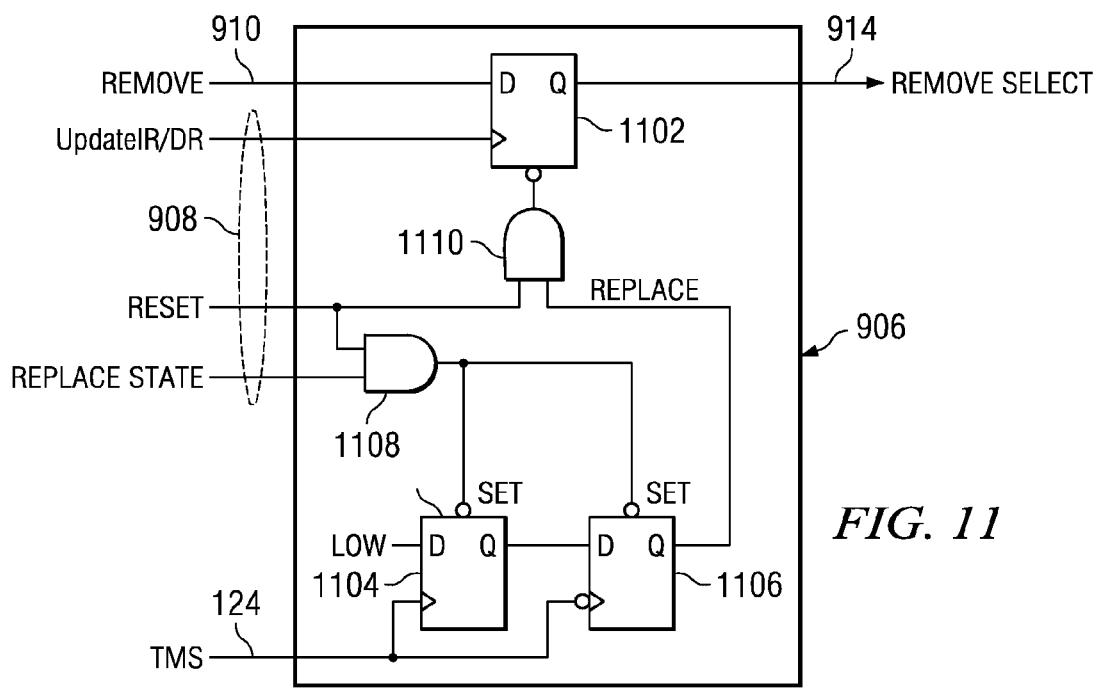
FIG. 11 illustrates an example multiplexer control circuit for controlling the removal and replacement of TDS circuits according to the present invention.

FIG. 11 illustrates in detail the multiplexer control circuit 906, which functions to control the removal and replacement operations of the TDS circuit 920 in the IC's 902 TDI to TDO scan path. The multiplexer control circuit 906 contains three DFFs 1102-1106, and two And gates 1108-1110.

The data input of DFF 1102 is coupled to Remove signal 910 from TDS circuit 920 output bus 126. The rising edge triggered clock input of DFF 1102 is coupled to either the UpdateIR or UpdateDR control signal from Tap controller output bus 908, depending upon which TDS 920 scan path register (IR or DR) is used to provide the Remove signal 910. The data output of DFF 1102 is coupled to the Remove Select signal 914 which, as previously described, is input to multiplexer 914 and TDS circuit 920. The reset input of DFF 1102 is coupled to the output of And gate 1110. One input of And gate 1110 is coupled to the Reset signal from the TDS 920 circuit's Tap controller 204 on bus 908. The other input of And gate 1110 is coupled to the data output of DFF 1106.

The data input of DFF 1104 is coupled to a logic low value. The data output of DFF 1104 is coupled to the data input of DFF 1106. The data output of DFF 1106 is coupled to And gate 1110 and is referred to as the Replace signal. The rising edge triggered clock input of DFF 1104 is coupled to the TMS signal from bus 124. The falling edge triggered clock input of DFF 1106 is also coupled to the TMS signal from bus 124. Both DFFs 1104 and 1106 have a low active Set input that is coupled to the output of And gate 1108. One input of And gate 1108 is coupled to the Reset input from bus 908 and the other input of And gate 1108 is coupled to a Replace State signal from bus 908. The Replace State signal is a signal that indicates the Tap controller 204 of TDS 920 is in an appropriate state for the special protocol to be issued for replacing a removed TDS 920 back into the ICs TDI to TDO scan path. In the examples illustrated in this specification for the purpose of describing the invention, the appropriate states for producing the Replace State signal are selected to be the RunTest/Idle state 1204, Shift-DR state 1214, Shift-IR state 1210, Pause-DR state 1206, and Pause-IR state 1208 of the Tap state diagram of FIG. 12.

When the Tap controller of TDS 920 is in one of these states, the Replace State signal will be set high. During all other Tap states the Replace State signal is set low. One example circuit for producing the Replace State signal on bus 908 when the Tap controller of TDS 920 is in one of the above mentioned states is illustrated as Or gate 1218 of FIG. 12. In this example, the Or gate 1218 would be included in the Tap controller of TDS 920 to output the Replace State signal on bus 908. Alternately, Or gate 1218 could be included external of the TDS 920 Tap controller or in the multiplexer control circuit 906 if desired. Including it in the TDS 920 Tap controller allows outputting one signal (Replace State) from the Tap controller on bus 908 to multiplexer control circuit 906 as opposed to having to output five signals (RunTest/Idle, Shift-DR, Shift-IR, Pause-DR, Pause-IR) from the Tap controller on bus 908 if included in the multiplexer control circuit 906 or external of the Tap controller. While these Tap controller states have been seen most appropriate to be selected and used by the present invention, different, more, or less Tap controller states could be selected as well by design choice.

When the Tap domain selection architecture of IC 902 is reset at power up or by moving the Tap controllers 204 to their Test Logic Reset state 1202 by asserting a low on TRST 124 or by applying five logic ones on TMS 124, the Reset signal on bus 908 from the TDS 920 Tap controller 204 is set low. The low on the Reset signal clears DFF 1102 to a logic zero output on Remove Select signal 914 and sets DFFs 1104 and 1106 to output logic ones (the Replace signal to And gate 1110 is set high). While the Tap controller 204 of TDS 920 is in the Test Logic Reset state 1202, the Replace State signal will be low since the Tap controller is not in any of the selected Tap states. The low on the Replace State signal will maintain DFFs 1104 and 1106 in a set state (Replace is high) when the Tap controller 204 of TDS 920 exits the Test Logic Reset state and enters any of Tap states other than RunTest/Idle, Shift-DR, Shift-IR, Pause-DR, or Pause-IR.

With the TDS circuit 920, multiplexer control circuit 906, and multiplexer 904 of circuit block 916 initialized as described above, the TDI to TDO scan path of IC 902 includes the TDS circuit in with the currently selected Tap domain(s) in circuit block 106. Thus the ICs scan path appears as shown and described in regard to FIGS. 5 and 7, with the exception that circuit blocks 916 replace the TDS circuits 104 in the Figures. In this configuration, the TDS circuits 920 of circuit blocks 916 may operate to select different Tap domains to be included in or excluded from the IC's scan path. When it is desired to remove the TDS circuits from the IC's scan path, the Remove signal input to multiplexer control circuit 906 on bus 910 from TDS 920 is set high.

As mentioned in regard to FIG. 3, the IR 206 and DR 208 of TDS 104 and TDS 920 may include both a bus output 310 from the Update Register 306 and a bus output 312 from the Shift Register 304. Both of these buses form the output bus 212 of the DR and the output bus 214 of the IR. Buses 212 and 214 in turn form the output bus 126. The Remove signal 910 from TDS 920 is a signal from bus 126 and can come from either bus 310 or 312 of IR bus 212 or DR bus 214. Preferably, but not necessarily, the Remove signal 910 will come from bus 312 of the IR or bus 312 of the DR. The advantage in doing this is that the Remove signal is made available at the input of DFF 1102 so that the UpdateIR control signal (if from the IR) or the UpdateDR control signal (if from the DR) can clock the Remove signal into DFF 1102 at the same time as the control signals (UpdateIR or UpdateDR) clock data from the Shift Register 304 into the Update Register 306. This method allows the DFF 1102 to appear as an additional Update Register bit of either the IR or DR scan path.

For example, and assuming the Remove signal is selected to come from the IR 206, data will be shifted into the IR's Shift Register 304 during the Shift-IR state 1210 of the Tap controller, then updated into the IR's Update Register 306 in response to the UpdateIR control signal during the Update-IR state 1212 of the Tap controller. Since the Remove signal 910 is output from the IR's Shift Register on bus 312 to DFF 1102, both the IR's Update Register 306 and DFF 1102 will be updated in response to the UpdateIR control signal at the same time. Thus changes in the output of DFF 1102 (Remove Select) will occur synchronous to changes in the output bus 310 of IR Update Register 306. Similarly, if the Remove signal 910 is selected to come from the DR 208, this approach will cause a change in the output of DFF 1102 to occur synchronous to changes in the output bus 310 of the DR's Update Register 306. If the Remove signal were to be input to DFF 1102 from the IR's or DR's Update Register bus 310, it is clear that the change in the output of DFF 1102 could not occur at the same time as the change in output bus 310 since bus 310 has to change first to provide the Remove signal to the input of DFF 1102. While the circuit examples of the present invention are designed such that the changes in the outputs of DFF 1102 and Update Register 306 occur synchronously, it should be clear that other example circuits could be designed to support a non-synchronous change approach. For example, the clock input of DFF 1102 could be made falling edge triggered to allow for receiving the Remove signal from the Update Register 306 bus 310 on the rising edge of the UpdateIR or UpdateDR control signal and clocking the Remove signal into the DFF 1102 on the falling edge of the UpdateIR or UpdateDR control signal.

The decision as to whether the Remove signal 910 comes from the IR 206 or the DR 208 of the TDS 920 Tap controller is by design choice. One advantage of having the Remove signal come from the IR 206 instead of from the DR 208 is that it allows Tap domain selection and TDS circuit 920 removal operations to occur in a single step process, i.e. in response to only an IEEE 1149.1 instruction scan operation. If the Remove signal came from the DR 208, Tap domain selection and TDS circuit removal operations would require a two step process, i.e. an IEEE 1149.1 instruction scan to select the DR 208 followed by an IEEE 1149.1 data scan to load data into the selected DR to perform the Tap domain selection and TDS circuit removal operation.

From the above description it is clear that outputting the Remove signal from TDS 920 to multiplexer control circuit 906 using IEEE 1149.1 instruction and data scan operations will cause the Remove Select 914 signal to be set high. Once Remove Select 914 is set high, multiplexer 904 couples serial path 118 to the IC's TDO output 912 and enables the function of the blocking circuit 1002 in the TDS's Tap controller. This brings about the TDS removal aspect of the present invention and enables the TDI to TDO scan path configurations shown in FIGS. 6 and 8. It is clear that once the TDS 920 is removed from the TDI to TDO scan path, conventional IEEE 1149.1 instruction and data scans cannot be used to replace it back into the TDI to TDO scan path since access to the TDS's IR and DR are no longer available. The following description describes the TDS replacement aspect of the present invention.

The replacement of TDS 920 back into the IC's TDI to TDO scan path is achieved by the previously mentioned special protocol, which is based on a non-conventional operation of the TMS and TCK signals of bus 124. As seen in FIG. 11, if the Replace State and Reset signals of bus 908 are high, DFFs 1104 and 1106 may be clocked by the TMS 124 signal. In this condition, a clock pulse comprising a rising edge and a falling edge on TMS 124 will cause the low input of DFF 1104 to be clocked to the Replace output of DFF 1106. Clocking the Replace output of DFF 1106 to a low will clear DFF 1102, causing the Remove Select output 914 to be set low. With Remove Select set low, multiplexer 904 selects TDS serial output 918 to be coupled to the IC's TDO output 912 and allows the blocking circuit 1002 to couple Tap control output bus 1004 to IR and DR control input bus 1006. Thus after the special protocol is input on TMS 124, the TDS 920 is again replaced in the ICs TDI to TDO scan path and made available for access. This brings about the TDS replacement aspect of the present invention and enables the TDI to TDO scan path configurations shown in FIGS. 5 and 7.

Figure 13:
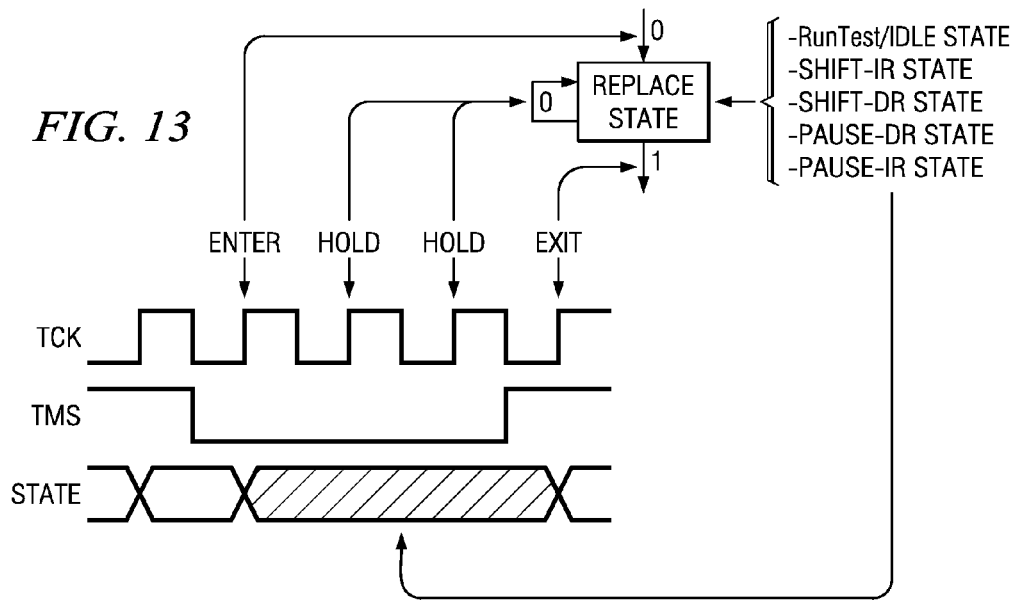
FIG. 13 illustrates a first timing example of a convention IEEE 1149.1 state entry and exit.

In FIG. 13, an example is shown of conventional operation of the TCK and TMS signals moving the Tap controller into and from Tap controller states Run/Test Idle 1204, Shift-IR 1210, Shift-DR 1214, Pause-IR 1208, and Pause-DR 1206. These states, as indicated in FIG. 12, are referred to as the Replace State. As previously mentioned, the Replace State signal on bus 908 is set high during the Replace State. Referring to both FIGS. 12 and 13, it is seen that these states are entered by asserting a logic zero on TMS. After entering the states, the Tap controller will hold in these states if TMS remains a logic zero. Exit from the states is achieved by asserting a logic one on TMS. The function of each of these Tap controller states is well known and described in the IEEE 1149.1 standard.

Figure 14:
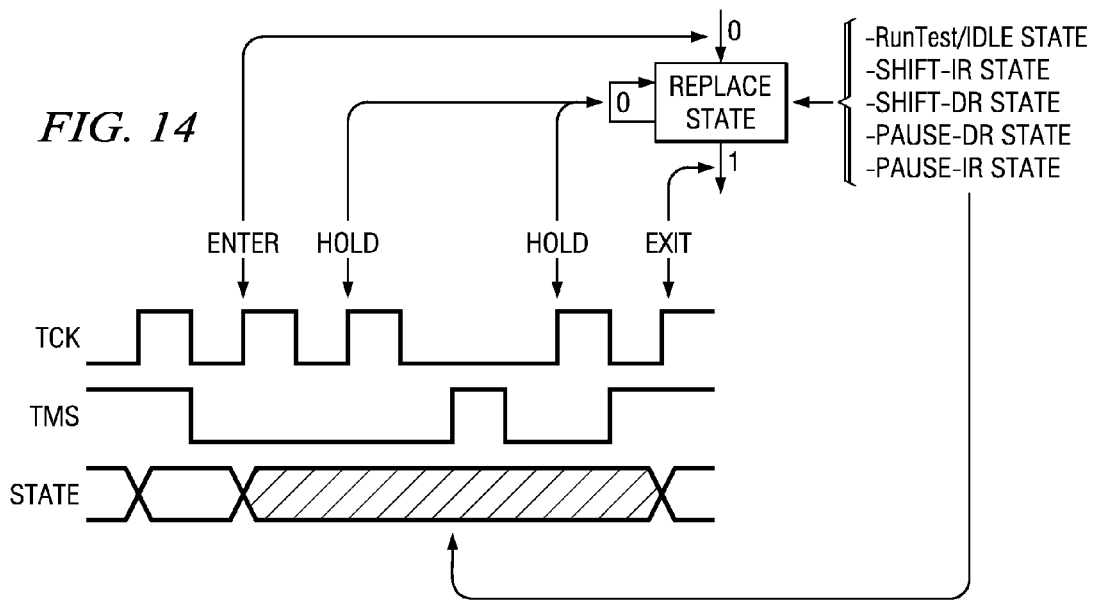
FIG. 14 illustrates the modification of the first timing of FIG. 13 to allow inputting of the special protocol of the present invention for replacing TDS circuits.

FIG. 14 illustrates the application of the special protocol used to replace the TDS circuit 920 back into the IC's TDI to TDO scan path to realize the configurations seen in FIGS. 5 and 7, with TDS 920 substituted for TDS 104. As seen, the Replace State is conventionally entered by asserting a logic low on TMS. In this example, the TMS signal is held low to cause a first Hold operation to occur in the Replace State. Following this first Hold operation the TCK is halted at a logic zero level. While TCK is halted, a clock pulse is input on TMS. This TMS clock pulse, as described above, sets the Replace output of DFF 1106 low to enable and insert the TDS circuit back into the IC's TDI to TDO scan path. Following the TMS clock pulse, the TCK is again made active to perform a second Hold operation. Following the second Hold operation, TMS is set high to cause an Exit from the Replace State on the next TCK clock.

Figure 15:
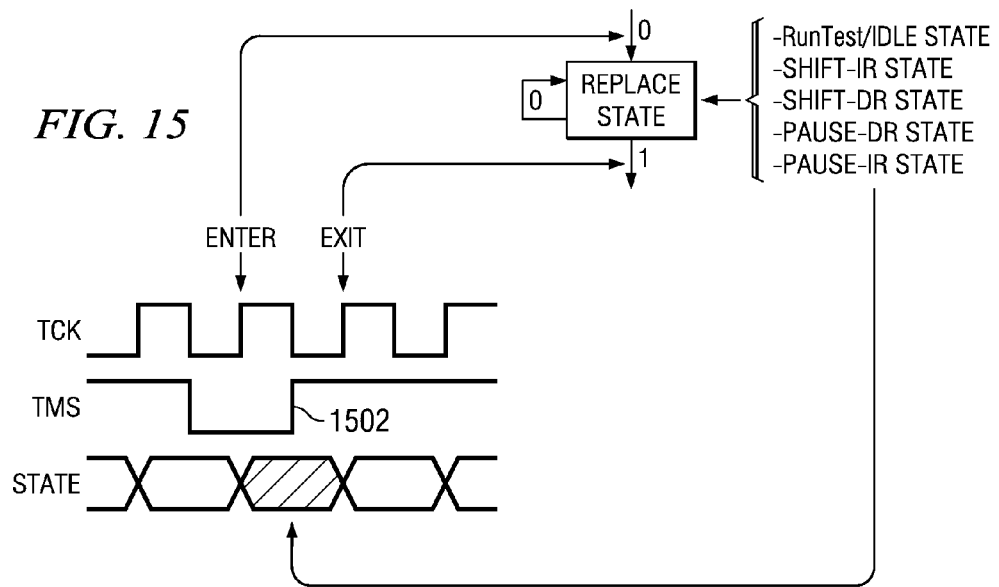
FIG. 15 illustrates a second timing example of a convention IEEE 1149.1 state entry and exit.

In FIG. 15, an example is shown of conventional operation of the TCK and TMS signals moving the Tap controller into and from Tap controller states Run/Test Idle 1204, Shift-IR 1210, Shift-DR 1214, Pause-IR 1208, and Pause-DR 1206, again indicated as the Replace State. In this example, the Tap controller does not Hold in the Replace State as it did in FIGS. 13 and 14, but simply passes through it by setting TMS low to Enter the Replace State and then high to Exit the Replace State.

Figure 16:
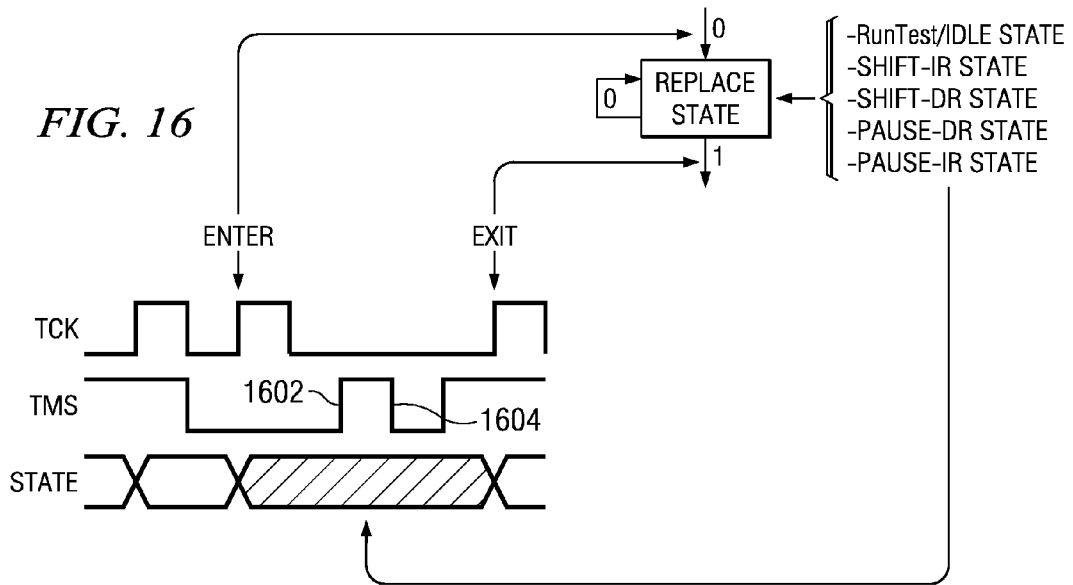
FIG. 16 illustrates the modification of the second timing of FIG. 13 to allow inputting of the special protocol of the present invention for replacing TDS circuits.

FIG. 16 illustrates the application of the special protocol used to replace the TDS circuit 920 back into the IC's TDI to TDO scan path. As seen, the Replace State is conventionally Entered by asserting a logic low on TMS. After the Replace State is Entered, the TCK is halted at a logic zero level. While TCK is halted, a clock pulse is input on TMS. This TMS clock pulse, as described above, sets the Replace output of DFF 1106 low to enable and insert the TDS circuit back into the IC's TDI to TDO scan path. Following the TMS clock pulse, TMS is set high then the TCK is made active to perform the Exit operation from the Replace State.

While the examples of FIGS. 14 and 16 show the TCK halted at logic zero level when the special protocol (clock pulse) is input on TMS, the TCK could have been halted at a logic one level as well. Further, while the special protocol is described as a single clock pulse occurring on TMS during the Replace State and while TCK is halted, the special protocol could be multiple clock pulses occurring during the same conditions. For example, the simple DFF 1104 and DFF 1106 circuit arrangement in multiplexer controller 906 could be replaced with a different circuit that requires more that one TMS clock pulse to set the Replace output signal to And gate 1110 high. Thus while the special protocol of the present invention is described as requiring only one TMS clock pulse to occur while in the Replace State with TCK halted, any number of TMS clock pulses may be produced during the same conditions. It is important to note that the special protocol shown in FIGS. 14 and 16 is not recognized by the Tap controller 204 of any Tap domain, since the TCK is halted. Thus the special protocol can be used to replace TDS circuits 920 back into an IC's TDI to TDO scan path without modifying the state of any Tap Domain, i.e. the input of the special protocol is transparent to all conventional IEEE 1149.1 test circuitry coupled to the TMS and TCK signals 124. It is possible to not have to halt the TCK if the TMS clock pulse(s) can be applied during an appropriate point in time within a single TCK clock period.

In normal operation of the Tap controller, the TMS signal 124 may change state once between first and second TCK inputs 124. For example, in FIG. 15 the normal operation of the TMS signal is seen to change state at point 1502 in the timing diagram between the Enter TCK and the Exit TCK inputs, i.e. during the shaded Replace State time frame. Since this TMS state change occurs in the Replace State (Replace State input to And gate 1108 is high), DFF 1104 of FIG. 11 will be enabled to clock in the low at its input. Since during normal operation a second TMS state change does not occur, the low at the output of DFF 1104 is not allowed to be clocked into DFF 1106 to set the Replace signal low. When the Tap controller transitions, during the Exit TCK, to a state different from the Replace State, DFF 1104 will be set back high by the low input on the Replace State signal to And gate 1108. Thus during Tap controller operation, the low at the input of DFF 1104 cannot be clocked to the output of DFF 1106. This prevents the special protocol from being falsely recognized during normal operation of the Tap controller.

The special protocol is designed to be recognized only when the TMS signal changes state at least twice while the Tap controller is in the Replace State. Using the special protocol example shown in FIG. 16, it is seen that the first TMS state change occurs at point 1602 of the timing diagram and the second TMS state change occurs at point 1604 of the timing diagram. DFF 1104 serves to detect the first TMS state change at point 1602 to clock in the low at its input and DFF 1106 serves to detect the second TMS state change at point 1604 to clock the low input from DFF 1104 to its Replace output. Thus the arrangement of DFFs 1104 and 1106 are designed to only recognize the special protocol if and only if both TMS state transitions 1602 and 1604 occur between the Enter TCK and Exit TCK of FIG. 16. This insures the Replace signal output of DFF 1106 can never be set low during normal operation of the TMS signal, which as mentioned above only changes state once between TCK inputs.

Figure 17:
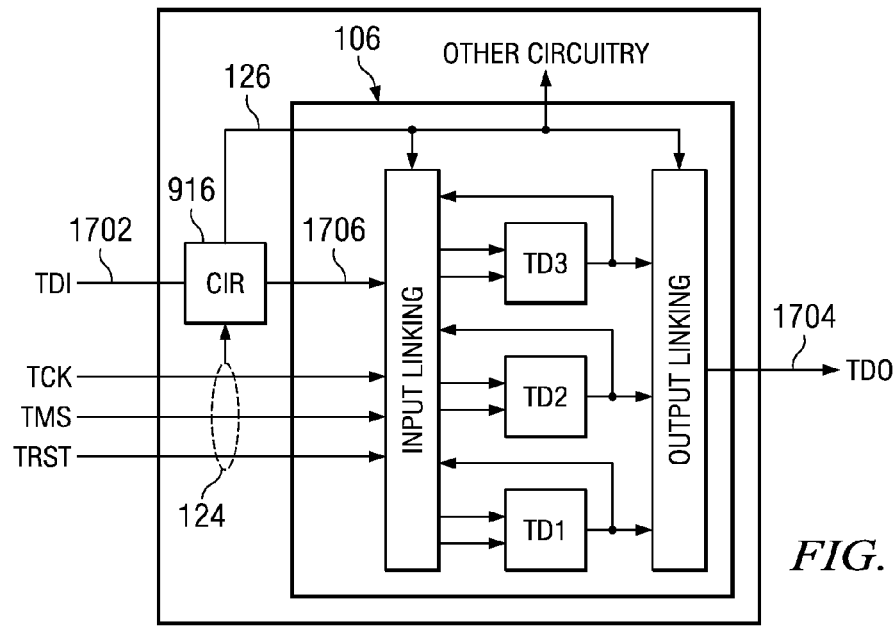
FIG. 17 illustrates an alternate placement of the TDS removal and replacement circuitry of the example in FIG. 9.

FIG. 17 is shown to simply indicate that circuit block 916 may exist at the beginning (near TDI) of an IC's TDI to TDO scan path instead of at the ending (near TDO) as seen in FIG. 9. If placed at the beginning of an IC's TDI to TDO scan path, the IC's TDI input 1702 would be coupled to TDS circuit 920 and multiplexer circuit 904 of circuit block 916 in place of the serial path output 118 of Tap domain circuit block 106 in FIG. 9. The output 1706 of multiplexer circuit 904 of circuit block 916 would be coupled to the TDI input of Tap domain circuit block 106 in place of the IC's TDI input of the example in FIG. 9. The serial path output 118 of Tap domain block 106 would be coupled to the IC's TDO output 1704. The function of TDS 920 to select Tap domains in circuit block 106 and to remove and replace itself in the IC's TDI to TDO scan path is independent of its position in the IC's TDI to TDO scan path.

Figure 18:
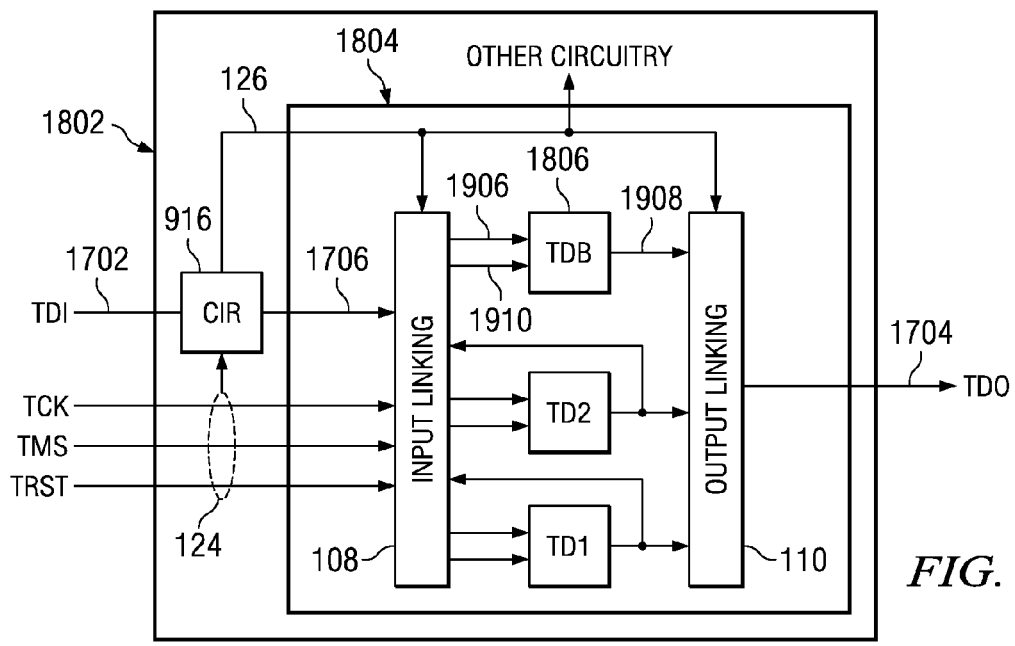
FIG. 18 illustrates an IC including the TDS removal and replacement circuit, multiple Tap domains, and a Tap Domain Bypass (TDB) circuit according to the present invention.

FIG. 18 illustrates use of circuit block 916 in an IC 1802 with a Tap domain circuit block 1804 that contains two Tap domains TD1 and TD2 as previously described and a new circuit referred to as a Tap Domain Bypass (TDB) circuit 1806. As seen, circuit block 916 is positioned next to TDI, which as mentioned in regard to FIG. 17 does not effect its operation. This example is similar to the one in FIGS. 9 (and 17) in that circuit block 916 can select any one or both of the two Tap domains TD1 and TD2 in circuit block 1804 between the IC's TDI 1702 to TDO 1704 leads. This example differs from the FIGS. 9 and 17 examples in that the new TDB circuit 1806 can also be selected between the IC's TDI and TDO leads. Selecting the TDB circuit 1806 between the TDI and TDO leads and removing TDS 920 provides a scan path through the IC that only includes a single scan register bit during both IEEE 1149.1 instruction and data register scan operations. Conventional IEEE 1149.1 Tap domain architectures have a bypass register bit that be selected to provide a single scan register bit between an IC's TDI and TDO leads during data register scan operations. However during instruction scan operations, conventional IEEE 1149.1 Tap domain architectures always scan through the instruction register from TDI to TDO. The TDB circuit 1806 of FIG. 18 provides an approach whereby all Tap domains in an IC are bypassed and scan operations occur through a single scan register bit between the IC's TDI and TDO leads during both data and instruction scan operations.

Figure 19:
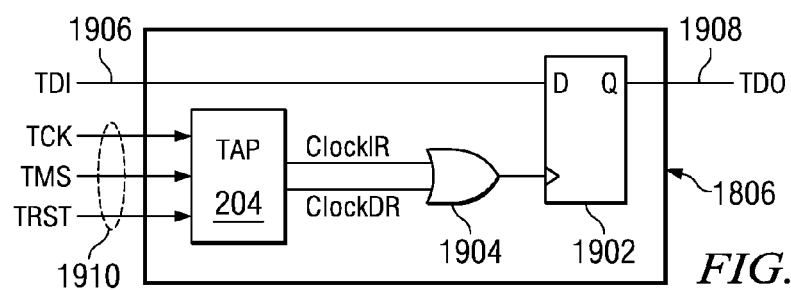
FIG. 19 illustrate and example circuit for implementing the TDB circuit of FIG. 18 according to the present invention.

FIG. 19 illustrates an example TDB circuit 1806. The TDB circuit consists of a DFF 1902, an Or gate 1904, and a Tap controller 204. The input to DFF 1902 is coupled to TDI 1906 which is input from the input linking circuit 108 of FIG. 18 as described for the Tap domains TD1-3 of FIG. 1. The output of DFF 1902 is coupled to TDO 1908 which is output to the output linking circuit 110 of FIG. 18 as described for the Tap domains TD1-3 of FIG. 1. The clock input of DFF 1902 comes from the output of Or gate 1904. The inputs of Or gate 1904 are coupled to the ClockDR and ClockIR outputs from Tap controller 204. The Tap controller's TMS, TCK, and TRST inputs 1910 come from the input linking circuit 108. When TDB 1806 is selected between TDI and TDO and its Tap controller 204 is in the Shift-DR 1214 state during data scan operations, the ClockDR output will be active to pass through the Or gate to shift data through DFF 1902 from TDI 1906 to TDO 1908. When TDB 1806 is selected and its Tap controller 204 is in the Shift-IR 1210 state during instruction scan operations, the ClockIR output will be active to pass through the Or gate to shift data through DFF 1902 from TDI 1906 to TDO 1908. When TDB 1806 is selected between the TDI and TDO leads of IC 1802 and TDS 920 of circuit block 916 is removed, the Tap domains TD1-2 will be deselected and a single scan path register bit (DFF 1902) will exist between the IC's TDI and TDO leads during both IEEE 1149.1 instruction and data scan operations.

Figure 20:
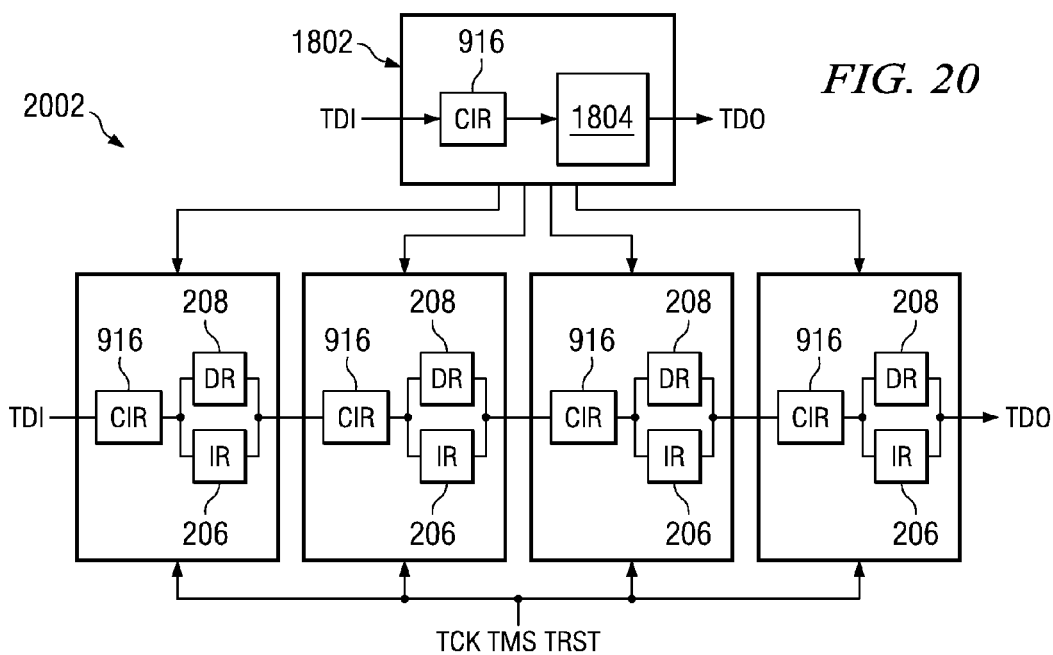
FIG. 20 illustrates a first scan path configuration whereby the ICs in the scan path contain multiple Tap domains, TDS removal and replacement circuitry, and the TDB circuit according to the present invention.

FIG. 20 illustrates a scan path 2002 containing four ICs 1802. Each IC is shown with TDS 920 of circuit block 916 in the scan path and with one Tap domain's IR 206 and DR 208 in the scan path. With the exception of TDS 920 of circuit block 916 being positioned near TDI this configuration is similar to that shown in FIG. 5.

Figure 21:
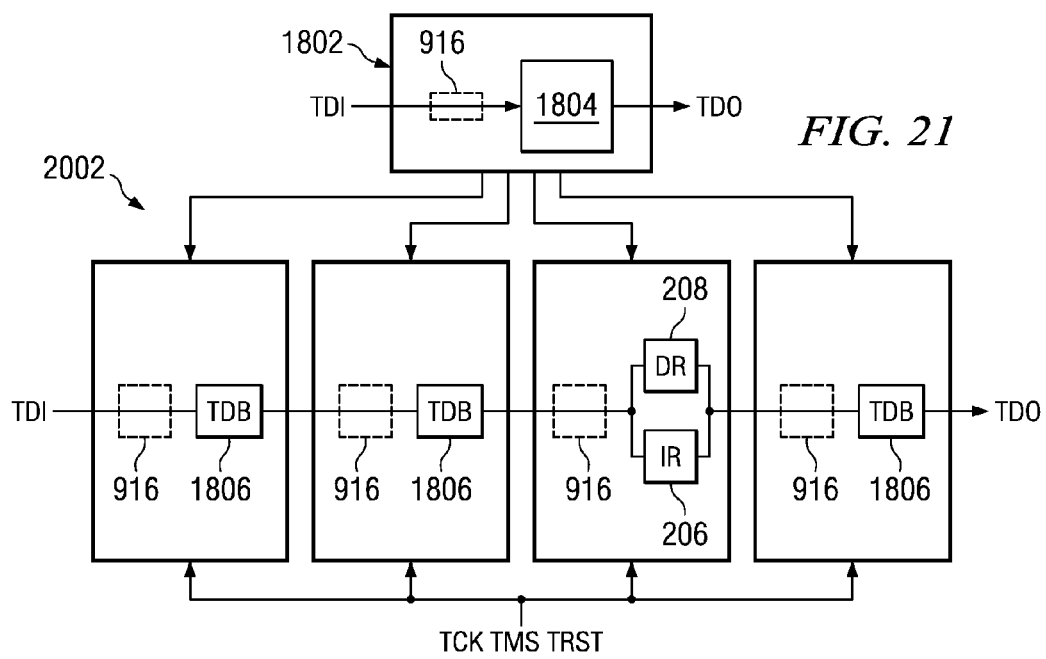
FIG. 21 illustrates a second scan path configuration whereby the ICs in the scan path contain multiple Tap domains, TDS removal and replacement circuitry, and the TDB circuit according to the present invention.

FIG. 21 illustrates the scan path 2002 of FIG. 20 after the first, second and fourth IC have had their TDB circuit 1806 selected and their TDS 920 of circuit 916 removed from their scan paths. The third IC has a Tap domain selected, TD1 or TD2, and has the TDS 920 removed from its scan path. In this configuration, the scan paths of the first, second, and fourth ICs appear as single scan bits during IEEE 1149.1 instruction and data scan operations to the third IC. Data scan patterns to the DR 208 of the third IC simply include leading and trailing pad bits to compensate for the TDB circuits 1806 of the first, second and fourth IC. Likewise, instruction scan patterns to the IR 208 of the third IC simply include the same leading and trailing pad bits to again compensate for the TDB circuits 1806 of the first, second, and fourth IC. The TDB circuits of the first, second, and fourth IC make the scan path 2002 appear as if it contains only the Tap domain of the third IC. Thus the instruction and data pattern set of the selected Tap domain of the third IC can be used directly once the pad bits have been added. After access of the Tap domain of the third IC is complete, the TDS circuits 906 of circuit blocks 916 are replaced in the scan path 2002, using the special protocol, to allow selecting Tap domains of another IC or ICs and accessing those Tap domains via TDB circuits 1806 in the other ICs.

Figure 22:
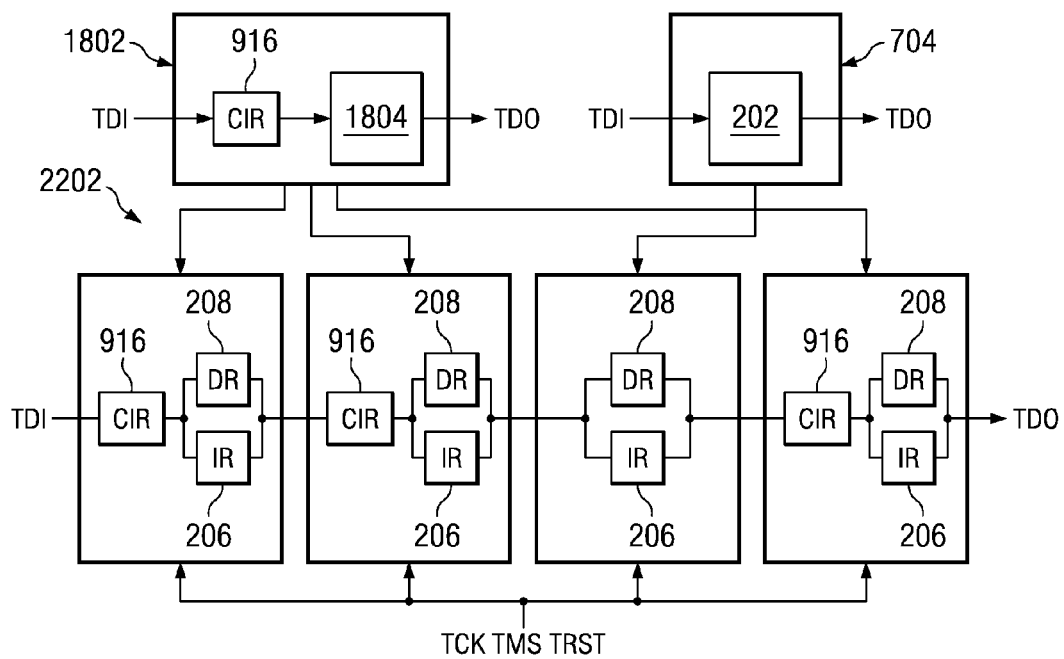
FIG. 22 illustrates a first scan path configuration that consists of ICs containing multiple Tap domains, TDS removal and replacement circuitry, and TDB circuits, and a legacy IC that contains only one Tap domain according to the present invention.

FIG. 22 illustrates a scan path 2202 containing four ICs. The first, second and fourth ICs 1802 contain circuit blocks 916 and 1804. The third IC 704 is a legacy IC that only contains one Tap domain 202. The purpose of this example is to show that ICs including the TDB circuit 1806 of the present invention may operate in a scan chain with legacy ICs, like in FIG. 7. In FIG. 22 the first, second and fourth ICs 1802 include one selected Tap domain's IR 206 and DR 208 and TDS 920 of circuit block 916 in the scan path.

Figure 23:
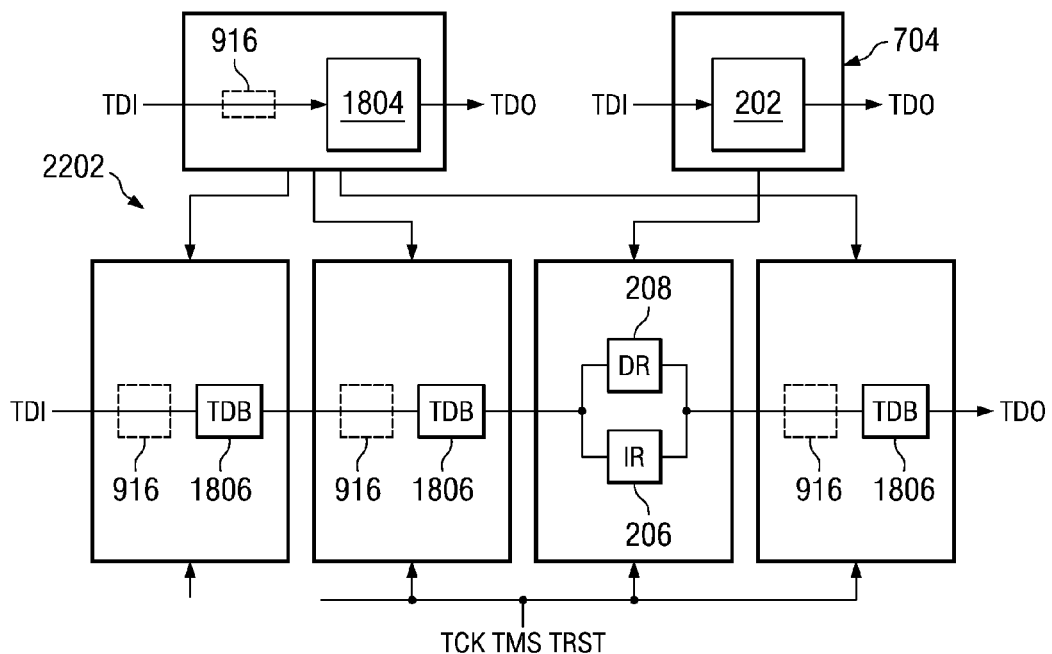
FIG. 23 illustrates a second scan path configuration that consists of ICs containing multiple Tap domains, TDS removal and replacement circuitry, and TDB circuits, and a legacy IC that contains only one Tap domain according to the present invention.

FIG. 23 illustrates the scan path 2202 after the first, second, and fourth ICs have selected their TDB circuit 1806 and have removed their TDS circuit 920. As can be seen, IEEE 1149.1 instruction and data scan operations to the legacy IC 704 is simplified and streamlined due to the single scan register bit paths through the TDB circuits 1806 of the first, second, and fourth ICs.

Figure 24:
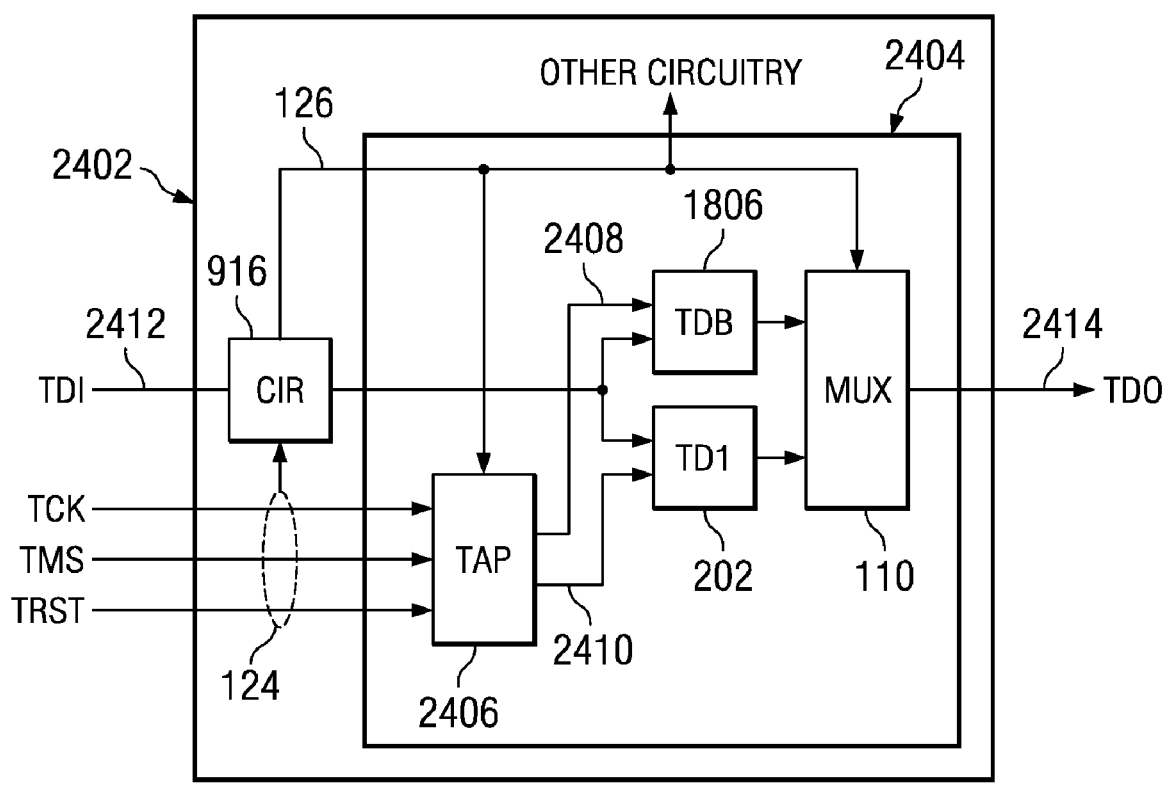
FIG. 24 illustrates an example IC that contains a single Tap domain, TDS removal and replacement circuitry, and a TDB circuit according to the present invention.

FIG. 24 illustrates an IC that contains circuit block 2404 and circuit block 916. Circuit block 2404 contains a single Tap domain 202, TDB circuit 1806, input linking circuit 2406 and output linking circuit 110. Tap domain 202 is assumed to be the IEEE standard 1149.1 boundary scan Tap domain. The input linking circuit 2406 differs from input linking circuit 108 in that it does not need TDI multiplexers since only one Tap domain exists in the circuit, which allows the IC's TDI input to be coupled directly to the TDI inputs of Tap domain 202 and TDB circuit 1806. The input linking circuitry 2406 only contains gating logic, controlled by bus 126, to selectively switch the IC's TMS and TCK inputs 124 to the TMS and TCK input buses 2408 and 2410 of TDB circuit 1806 and Tap domain 202, respectively. The IC's TRST input is always coupled to the Tap domain 202 and TDB 1806. This example illustrates that the IEEE 1149.1 boundary scan Tap domain may be augmented to include TDB circuit 1806 and circuit block 916 to allow the IC to operate using either the IEEE 1149.1 Tap domain coupled between TDI 2412 and TDO 2414 or the TDB circuit 1806 coupled between TDI and TDO. Thus ICs like that of FIG. 24 would have a conventional IEEE 1149.1 mode of operation and the new mode of operation whereby the IC's TDI and TDO leads may be coupled together via a single scan register bit (DFF 1902) to simplify and streamline instruction and data scan operations to other ICs coupled to IC 2402 in a scan path.

Although the present invention has been described in detail, it should be understood that various changes, substitutions and alterations may be made without departing from the spirit and scope of the invention as defined by the appended claims.

What is claimed is:

1. TAP removal and replacement circuitry comprising:
   A. a test data input lead;
   B. a test data output lead;
   C. a test clock input lead;
   D. a test mode select input lead;
   E. TAP domain selection circuitry having inputs coupled to the test data input lead, the test clock input lead, and the test mode select input lead, and having a serial output, a remove control output, and a control output bus;
   F. multiplexer circuitry having one data input coupled to the test data input lead, another data input connected to the serial output, a control input, and an output coupled to the test data output lead; and G. multiplexer control circuitry having an input connected to the test mode select input lead, a remove control input connected to the remove control output of the TAP domain selection circuitry, a connection with the control output bus, and a control output connected to the control input of the multiplexer circuitry.

2. The circuitry of claim 1 including an integrated circuit having plural TAP domains, and the TAP removal and replacement circuitry being connected between the plural TAP domains and the test data output lead.

3. The circuitry of claim 1 including an integrated circuit having plural TAP domains, and the test access port removal and replacement circuitry is connected between the test data input lead and the plural TAP domains.

4. The circuitry of claim 1 including a test reset input lead and the TAP domain selection circuitry having an input connected to the test reset input lead.

5. The circuitry of claim 1 including:
i. plural TAP domains each having a test data input selectively coupled to the test data input lead, a test data output selectively coupled to the test data output lead, a test clock input selectively coupled to the test clock input lead, and a test mode select input selectively coupled to the test mode select input lead;
ii. input linking circuitry connected to the test data input lead, the test clock input lead, and the test mode select input lead and connected to the test data input, test clock input, and the test mode input of each of the plural TAP domains, the input linking circuitry having control inputs connected to the control output bus; and
iii. output linking circuitry connected to the test data output of each TAP domain and having a test data output connected to the test data output lead, the output linking circuitry having control inputs connected to the control output bus.

* * * * *